United States Patent [19]

Teraguchi

[11] Patent Number: 5,701,035
[45] Date of Patent: Dec. 23, 1997

[54] ELECTRODE STRUCTURE AND METHOD FOR FABRICATING THE SAME

[75] Inventor: Nobuaki Teraguchi, Nara-ken, Japan

[73] Assignee: Sharp Kabushiki Kaisha, Osaka, Japan

[21] Appl. No.: 504,101

[22] Filed: Jul. 19, 1995

[30] Foreign Application Priority Data

Jul. 19, 1994 [JP] Japan ................................. 6-167124

[51] Int. Cl.⁶ ................................. H01L 23/48; H01L 23/52; H01L 29/40
[52] U.S. Cl. ................................. 257/747; 257/747; 257/744
[58] Field of Search ................................. 257/747, 76, 743, 257/744

[56] References Cited

U.S. PATENT DOCUMENTS 5,422,500  6/1995  Tomokawa et al. ................. 257/77
5,432,808  7/1995  Hatano et al. ................. 257/77

FOREIGN PATENT DOCUMENTS 5-291621  11/1993  Japan .

OTHER PUBLICATIONS

Nakamura et al., "P-GaN/N-InGaN/N-GaN double-heterostructure blue-light-emiiting diodes" *Jpn. J. Appl. Phys.* (1993) 32:L8-11.

Lin et al., "Low resistance ohmic contacts on wide band-gap GaN" *Appl. Phys. Lett.* (1994) 64:1003-1005.

*Primary Examiner*—Mahshid D. Saadat
*Assistant Examiner*—Jhihan B. Clark
*Attorney, Agent, or Firm*—Morrison & Foerster, LLP

[57] ABSTRACT

The electrode structure of the invention includes a p-type $Al_xGa_yIn_{1-x-y}N$ ($0 \leq x \leq 1$, $0 \leq y \leq 1$, $x+y \leq 1$) semiconductor layer and an electrode layer formed on the semiconductor layer. In the electrode structure, the electrode layer contains a mixture of a metal nitride and a metal hydride.

3 Claims, 4 Drawing Sheets

ELECTRODE STRUCTURE AND METHOD FOR FABRICATING THE SAME

BACKGROUND OF THE INVENTION

1. Field of the Invention

The present invention relates to an electrode structure for a p-type $Al_xGa_yIn_{1-x-y}N$ ($0 \leq x \leq 1$, $0 \leq y \leq 1$, $x+y \leq 1$) semiconductor device, one of the Group III–V compound semiconductor devices containing nitrides, and a method for fabricating the same. More specifically, the present invention relates to an electrode structure having an ideal ohmic contact showing an extremely small contact resistance between a semiconductor layer and an electrode layer and a method for fabricating the same.

2. Description of the Related Art

Generally, in fabricating an electrode structure for an $Al_xGa_yIn_{1-x-y}N$ ($0 \leq x \leq 1$, $0 \leq y \leq 1$, $x+y \leq 1$) semiconductor device, nitrogen, one of the elements constituting the semiconductor, is likely to dissociate from the surface of a semiconductor layer in the electrode structure when the semiconductor layer is formed. Therefore, it is difficult to produce crystals satisfying a desirable stoichiometric ratio. When the dissociation of nitrogen forms the vacancies inside the crystal structure of the semiconductor layer, the conductivity type of the semiconductor layer turns into n-type. Therefore, in fabricating an electrode structure for an $Al_xGa_yIn_{1-x-y}N$ ($0 \leq x \leq 1$, $0 \leq y \leq 1$, $x+y \leq 1$) semiconductor device, it is difficult to form a p-type semiconductor layer.

As a method for turning a semiconductor layer containing nitrogen into a p-type semiconductor layer, it is well known to dope the semiconductor layer with magnesium (Mg) as an acceptor impurity. However, a p-type $Al_xGa_yIn_{1-x-y}N$ ($0 \leq x \leq 1$, $0 \leq y \leq 1$, $x+y \leq 1$) semiconductor layer formed by a commonly-used metalorganic chemical vapor deposition (MOCVD) method contains a large amount of hydrogen inside semiconductor crystals. A part of the hydrogen atoms are bonded with the Mg atoms functioning as an acceptor impurity, thereby preventing the Mg atoms from functioning as an effective acceptor. In order to activate the Mg atoms as an acceptor impurity, the semiconductor layer is subjected to an electron beam irradiation process or an annealing process within a nitrogen environment, thereby forming the p-type $Al_xGa_yIn_{1-x-y}N$ ($0 \leq x \leq 1$, $0 \leq y \leq 1$, $x+y \leq 1$) semiconductor layer. However, the p-type semiconductor layer subjected to such a process does not have a carrier density high enough to form an ideal ohmic contact between a semiconductor layer and an electrode layer.

On the other hand, various electrode structures usable for Group III–V compound semiconductor devices containing nitrides such as blue-light-emitting diodes have been conventionally developed. In the proposed electrode structures, various kinds of metals are used to form the electrode layer. For example, in order to form the electrode layer for a p-type $Al_xGa_yIn_{1-x-y}N$ ($0 \leq x \leq 1$, $0 \leq y \leq 1$, $x+y \leq 1$) semiconductor device, gold (Au) is most commonly employed ("P-GaN/N-InGaN/N-GaN Double-Heterostructure Blue-Light-Emitting Diodes", S. Nakamura et al., Jpn. J. Appl. Phys. (1993) p. L8). Japanese Laid-Open Patent Publication No. 5-291621 discloses that nickel (Ni), platinum (Pt) and silver (Ag) may be used in place of Au as the metals for forming the electrode layer.

However, in the case of using Au for the electrode layer, the contact resistance between the electrode layer and the semiconductor layer is large, and therefore an ideal ohmic contact cannot be obtained. In addition, the adhesiveness between the electrode layer and the semiconductor layer is inferior and the physical strength of the semiconductor device becomes disadvantageously weak.

On the other hand, in the case of using Ni, Pt or Ag for the electrode layer, the resulting adhesiveness is surely superior to that of Au, so that a more ideal ohmic contact can be obtained as compared with the case of using Au. However, in the case of using these metals, the following problems are caused, for example. In a light-emitting diode using these metals for the electrode layer, a differential resistance value at the current value of 10 mA is large, i.e., several tens of $\Omega$s. In other words, such a light-emitting diode has a high operational voltage, judging from the current-voltage characteristics thereof. In addition, since a laser diode using these metals for the electrode layer has a small electrode area, the contact resistance is increased as compared with a light-emitting diode. As a result, the operational voltage of the laser diode becomes larger than that of a light-emitting diode. This is why an electrode structure having a sufficiently ideal ohmic contact cannot be obtained even by the use of these metals.

In consideration of these problems, a conventional electrode structure using these metals for the electrode layer cannot be regarded as an ideal electrode structure for a p-type semiconductor device. Therefore, an electrode structure for a p-type semiconductor device having an ideal ohmic contact showing an extremely small contact resistance between a semiconductor layer and an electrode layer is eagerly sought.

SUMMARY OF THE INVENTION

The electrode structure of the invention includes a p-type $Al_xGa_yIn_{1-x-y}N$ ($0 \leq x \leq 1$, $0 \leq y \leq 1$, $x+y \leq 1$) semiconductor layer and an electrode layer formed on the semiconductor layer. In the electrode structure, the electrode layer contains a mixture of a metal nitride and a metal hydride.

In one embodiment, the metal nitride is selected from a group consisting of ScN, TiN, VN, CrN, ZrN, NbN, LaN and TaN.

In another embodiment, the metal hydride is selected from a group consisting of $YH_2$, $CeH_2$, $PrH_2$, $NdH_2$, $SmH_2$, $EuH_2$, $YbH_2$, $HfH_2$, $PdH$, $TmH$, $ErH$, $HoH$, $DyH$, $TbH$ and $GdH$.

According to another aspect of the invention, a method for fabricating an electrode structure is provided. The method includes a step of forming an electrode layer on a p-type $Al_xGa_yIn_{1-x-y}N$ ($0 \leq x \leq 1$, $0 \leq y \leq 1$, $x+y \leq 1$) semiconductor layer. The electrode layer is formed by sequentially depositing a nitride forming metal and a hydrogen absorbing metal on the semiconductor layer.

In one embodiment, the method for fabricating an electrode structure further includes a step of heat-treating the semiconductor layer and the electrode layer after the nitride forming metal and the hydrogen absorbing metal are sequentially deposited on the semiconductor layer.

According to still another aspect of the invention, a method for fabricating an electrode structure is provided. The method includes a step of forming an electrode layer on a p-type $Al_xGa_yIn_{1-x-y}N$ ($0 \leq x \leq 1$, $0 \leq y \leq 1$, $x+y \leq 1$) semiconductor layer. The electrode layer is formed by simultaneously depositing a nitride forming metal and a hydrogen absorbing metal on the semiconductor layer.

In one embodiment, the method for fabricating an electrode structure further includes a step of heat-treating the semiconductor layer and the electrode layer after the nitride forming metal and the hydrogen absorbing metal are simultaneously deposited on the semiconductor layer.

According to still another aspect of the invention, a method for fabricating an electrode structure is provided. The method includes a step of forming an electrode layer on a p-type $Al_xGa_yIn_{1-x-y}N$ ($0 \leq x \leq 1$, $0 \leq y \leq 1$, $x+y \leq 1$) semiconductor layer. The electrode layer is formed by depositing an intermetallic compound containing a nitride forming metal and a hydrogen absorbing metal on the semiconductor layer.

In one embodiment, the method for fabricating an electrode structure further includes a step of heat-treating the semiconductor layer and the electrode layer after the intermetallic compound is deposited on the semiconductor layer.

Thus, the invention described herein makes possible the advantages of (1) providing an electrode structure having an ideal ohmic contact showing an extremely small contact resistance between a semiconductor layer and an electrode layer; (2) providing an electrode structure including a semiconductor layer having a carrier density high enough to realize such an ideal ohmic contact; (3) providing an electrode structure in which crystals having an appropriate stoichiometric ratio are formed at the interface between the semiconductor layer and the electrode layer; (4) providing an electrode structure including a p-conductivity type semiconductor layer containing nitrogen atoms; (5) providing an electrode structure having excellent physical and chemical characteristics; and (6) providing a method for fabricating such an electrode structure.

These and other advantages of the present invention will become apparent to those skilled in the art upon reading and understanding the following detailed description with reference to the accompanying figures.

DESCRIPTION OF THE PREFERRED EMBODIMENTS

In this specification, a "nitride forming metal" refers to a metal whose free energy is reduced when the metal is nitrified. In addition, the expression "an electrode layer contains a mixture of a metal nitride and a metal hydride" includes the following meanings: (1) the electrode layer has a single-layered structure composed of the mixture; (2) the electrode layer has a multi-layered structure including at least one layer containing the metal nitride and at least one layer containing the metal hydride; (3) the electrode layer includes a portion containing the metal nitride and a portion containing the metal hydride; and (4) the electrode layer includes a layer composed of a compound consisting of the metal nitride and the metal hydride.

An exemplary electrode structure according to the present invention will be described below with reference to FIGS. 1 to 3.

Figure 1:
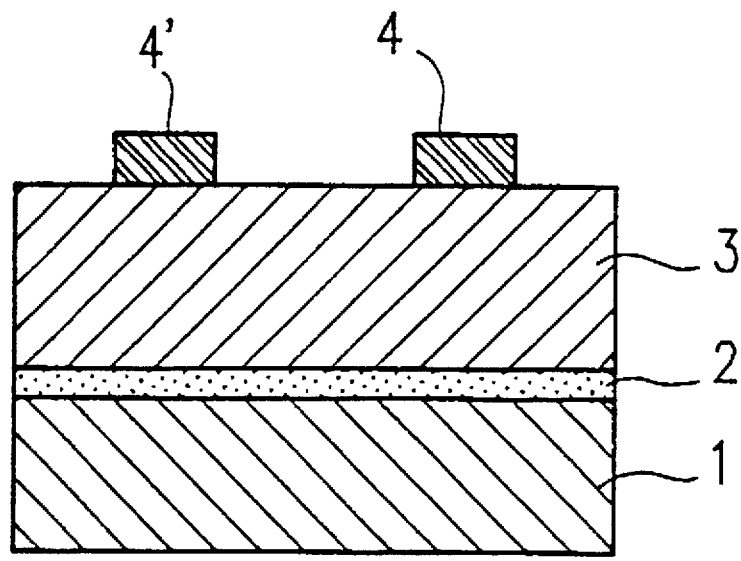
FIG. 1 is a cross-sectional view schematically showing an electrode structure according to an example of the present invention.

As shown in FIG. 1, the electrode structure of the invention includes: a buffer layer 2; a semiconductor layer 3 and electrode layers 4 and 4' on a substrate 1 in this order.

The substrate 1 can be made of sapphire, SiC or the like. The thickness of the substrate 1 is preferably in the range of 10 to 500 μm, and more preferably in the range of 100 to 300 μm.

The buffer layer 2 can be made of GaN, AlN or the like. The buffer layer 2 can be formed on the substrate 1 by a MOCVD method or the like. The thickness of the buffer layer 2 is preferably in the range of 10 to 100 nm, and more preferably in the range of 10 to 50 nm.

The semiconductor layer 3 can be made of a p-type $Al_xGa_yIn_{1-x-y}N$ ($0 \leq x \leq 1$, $0 \leq y \leq 1$, $x+y \leq 1$) semiconductor. The semiconductor layer 3 can be formed on the buffer layer 2 by a MOCVD method or the like. The thickness of the semiconductor layer 3 is preferably in the range of 2 to 6 μm, and more preferably in the range of 3 to 5 μm. The conductivity type of the semiconductor layer 3 can be controlled by doping the semiconductor layer 3 with a p-type impurity such as Mg.

Next, the electrode layers 4 and 4' will be described. Herein, for simplification, only the electrode layer 4 will be described except for the portion where the electrode layer 4' is required.

Examples of the metal nitrides contained in the electrode layer 4 include ScN, TiN, VN, CrN, ZrN, NbN, LaN and TaN, which are produced from nitride forming metals. Examples of the nitride forming metals include Sc, Ti, V, Cr, Zr, Nb, La and Ta.

Examples of the metal hydrides contained in the electrode layer 4 include $ScH_2$, $YH_2$, $LaH_2$, $CeH_2$, $PrH_2$, $NdH_2$, $SmH_2$, $EuH_2$, $YbH_2$, $TiH_2$, $ZrH_2$, $HfH_2$, VH, NbH, TaH and PdH, which are produced from hydrogen absorbing metals. Examples of the hydrogen absorbing metals include Sc, Y, La, Ce, Pr, Nd, Sm, Eu, Yb, Ti, Zr, Hf, V, Nb, Ta, Pd, Gd, Tb, Dy, Ho, Er and Tm.

In the previous paragraphs, Sc, Ti, V, Zr, Nb, La and Ta are cited as both the nitride forming metals and the hydrogen absorbing metals. However, it is noted that these metals are effective only as the nitride forming metals, not as the hydrogen absorbing metals. The reason is as follows. In the case where these metals are deposited on the semiconductor layer 3 to form the electrode layer 4, these metals first react with nitrogen so as to form the metal nitrides, but do not react with hydrogen. This is because the number of nitrogen atoms existing in the semiconductor layer 3 is far larger than the number of hydrogen atoms bonded with the Mg atoms in the semiconductor layer 3. Accordingly, hydrogen existing in the semiconductor layer 3 is not attracted to the interface between the semiconductor layer 3 and the electrode layer 4, so that the Mg atoms are not activated. As a result, since the carrier density in the interface between the semiconductor layer 3 and the electrode layer 4 becomes insufficient, the formation of the electrode layer 4 on the semiconductor layer 3 by depositing these metals on the semiconductor layer 3 does not always improve the ohmic characteristics of the semiconductor device. Consequently, it is preferable that Sc, Ti, V, Zr, Cr, Nb, La and Ta are used as the nitrogen forming metals and Y, Ce, Pr, Nd, Sm, Eu, Yb, Hf Pd, Gd, Tb, Dy, Ho, Er, and Tm are used as the hydrogen absorbing metals.

The thickness of the electrode layer 4 is preferably in the range of 100 to 500 nm, and more preferably in the range of 100 to 200 nm. The cross-sectional shape of the electrode layer 4 may be an arbitrary shape, e.g., circular, rectangular, polygonal, or the like. For example, in the case where the electrode layer 4 has a circular cross section, i.e., in the case where the electrode is cylindrical, the diameter of the cross section is preferably in the range of 400 to 600 μm, and the distance between the centers of the two electrode layers 4 and 4' is preferably in the range of 0.5 to 2 mm. However, these values are variable depending upon the applications thereof.

The electrode layer 4 can be formed by an electron beam vapor deposition method, a sputtering method or the like. For example, in the case where the electrode layer 4 is formed by the electron beam vapor deposition method, the ultimate background pressure is preferably $1 \times 10^{-7}$ Torr or less, and the pressure during the deposition is preferably $5 \times 10^{-7}$ Torr or less.

The electrode layer 4 can be formed by simultaneously depositing the nitride forming metal and the hydrogen absorbing metal on the semiconductor layer using the above-mentioned method, or the electrode layer 4 can also be formed by depositing an intermetallic compound containing the nitride forming metal and the hydrogen absorbing metal on the semiconductor layer. Alternatively, the electrode layer 4 may be formed by sequentially depositing the nitride forming metal and the hydrogen absorbing metal in this order (or in an inverse order) on the semiconductor layer, using the above-mentioned method. The electrode layer 4 may also be formed by alternately depositing the nitride forming metal and the hydrogen absorbing metal several times on the semiconductor layer, using the above-mentioned method.

Figure 2:
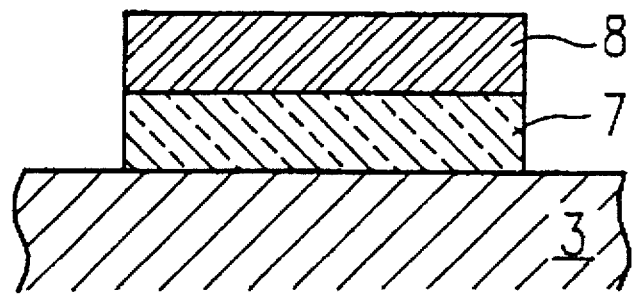
FIG. 2 is an enlarged cross-sectional view showing an electrode layer in the electrode structure according to an example of the present invention.

FIG. 2 shows an exemplary state where a metal hydride layer 7 and a metal nitride layer 8 are stacked in this order as the electrode layer 4 on the semiconductor layer 3. Herein, GaN is used for the semiconductor layer 3; Pd is used for the metal hydride layer 7; and Ti is used for the metal nitride layer 8.

A chemical reaction proceeds at the interface between the electrode layer 4 consisting of the Pd layer 7 and the Ti layer 8 and the GaN layer 3, i.e., the interface between the Pd layer 7 and the GaN layer 3. This chemical reaction can be caused when the Pd layer 7 and the Ti layer 8 are formed, or when the annealing is performed after the Pd layer 7 and the Ti layer 8 are formed. That is to say, a metal hydride PdH can be generated by the chemical reaction between Pd and hydrogen existing in the GaN layer 3, and a metal nitride TiN can be generated by the chemical reaction between Ti and nitrogen existing in the GaN layer 3. PdH and TiN thus generated can exist in the interface between the electrode layer 4 and the GaN layer 3 in any of the following states: (1) A layer composed of the mixture of PdH and TiN exists in the interface; (2) At least one layer containing PdH and at least one layer containing TiN exist in the interface; (3) PdH exists in at least a portion of the interface and TiN exists in at least a portion of the interface; or (4) A layer composed of a compound of PdH and TiN exists in the interface. The last state (4) is likely to be caused in the case where Pd and Ti are simultaneously deposited on the semiconductor layer 3.

In a preferred embodiment, after the electrode layer 4 is formed, an annealing is performed. The annealing can be performed by an electric furnace annealing method, a rapid thermal annealing (RTA) method or the like. The annealing temperature is preferably in the range of 100° to 1000° C., and more preferably in the range of 300° to 500° C. Although the annealing time is variable depending upon the annealing temperature, the time is preferably in the range of 5 to 30 minutes, and more preferably in the range of 5 to 10 minutes. By performing the annealing under these conditions, the reaction in the interface between the semiconductor layer and the electrode layer is promoted and the ohmic characteristics of the electrode structure are further improved.

Next, referring to FIG. 3, the interface portion between the semiconductor layer 3 and the electrode layer 4 will be briefly described below. FIG. 3 is an enlarged cross-sectional view showing the interface portion between the semiconductor layer 3 and the electrode layer 4.

Figure 3:
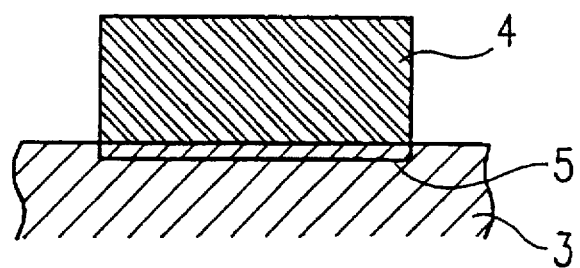
FIG. 3 is an enlarged cross-sectional view showing an interface portion between an electrode layer and a semiconductor layer in the electrode structure according to an example of the present invention.

As shown in FIG. 3, a semiconductor layer 5 having a high carrier density (a $p^+$-$Al_xGa_yIn_{1-x-y}N$:Si ($0 \leq x \leq 1$, $0 \leq y \leq 1$, $x+y \leq 1$) semiconductor layer: hereinafter, this layer will be called a "contact layer") is formed in the interface portion between the semiconductor layer 3 and the electrode layer 4 in the electrode structure thus obtained.

The carrier density of the contact layer 5 has become larger than the carrier density of the semiconductor layer 3 before the electrode layer 4 is formed. That is to say, by forming the contact layer 5, it is possible to realize an ideal ohmic contact showing an extremely small contact resistance in the interface between the semiconductor layer 3 and the electrode layer 4. Specifically, the carrier density of the contact layer 5 is preferably in the range of $10^{18}$ to $10^{20}$ cm$^{-3}$, and more preferably in the range of $10^{19}$ to $10^{20}$ cm$^{-3}$.

According to the present invention, it is possible to realize an ideal ohmic contact showing an extremely small contact resistance at the interface between the semiconductor layer 3 and the electrode layer 4. This effect can be obtained based on the following mechanism. The metal hydride in the electrode layer 4 attracts hydrogen existing in the semiconductor layer 3 to the interface between the semiconductor layer 3 and the electrode layer 4. As a result, the hydrogen atoms which have been bonded with Mg are attracted to the metal hydride, so that fresh Mg atoms are reproduced. In other words, the Mg atoms are activated. The activated Mg atoms function as an effective acceptor impurity, thereby forming a contact layer 5 having a high carrier density at the interface between the semiconductor layer 3 and the electrode layer 4. The existence of the contact layer 5 thus formed considerably reduces the width of the potential barrier at the interface between the semiconductor layer 3 and the electrode layer 4, thereby abruptly increasing the tunnel current flowing through the interface. As a result, the contact resistance between the semiconductor layer 3 and the electrode layer 4 becomes extremely small, and therefore an ideal ohmic contact is realized.

In addition, according to the present invention, the metal nitride in the electrode layer effectively attracts the nitrogen atoms existing in the semiconductor layer 3 to the interface between the semiconductor layer 3 and the electrode layer 4. Accordingly, even if the nitrogen atoms dissociate from the semiconductor layer 3 while the semiconductor layer 3 is being formed, so as to form the vacancies in the semiconductor layer 3, especially in the vicinity of the surface of the semiconductor layer 3, the nitrogen atoms attracted to the vicinity of the interface by the metal nitride compensate for the vacancies by filling them. Consequently, crystals having an appropriate stoichiometric ratio can be formed at the interface between the semiconductor layer 3 and the electrode layer 4. As a result, the portion in the vicinity of the surface of the semiconductor layer 3 can be effectively turned into a p-type semiconductor.

Moreover, according to the present invention, the semiconductor layer 3 is bonded with the electrode layer 4 at the interface therebetween because of the reaction. Accordingly, an excellent adhesiveness is realized at the interface between the semiconductor layer 3 and the electrode layer 4, so that the electrode structure of the invention has excellent physical and chemical properties. Such an electrode structure can be heat-treated at a high temperature, e.g., about 1000° C. Thus the annealing can be performed more effectively in order to promote the reaction at the interface and the activation of Mg, so that the ohmic characteristics are further improved.

As described above, according to the present invention, since the metal hydride and the metal nitride exist in the electrode layer, it is possible to obtain an excellent electrode structure, which has excellent physical and chemical properties, and an excellent ohmic contact for a p-type semiconductor device.

Hereinafter, the present invention will be described by way of illustrative examples with reference to the accompanying drawings. It is noted that the present invention is not limited to the following specific examples.

Example 1

In the first example, an electrode structure as shown in FIG. 1 is fabricated in the following way.

First, a buffer layer 2 made of GaN (thickness: 50 nm) is formed on a sapphire substrate 1 by a MOCVD method. Next, a semiconductor layer 3 made of an Mg-doped p-type GaN (thickness: 3 μm) is formed on the buffer layer 2 by a MOCVD method. The carrier density of the p-type GaN semiconductor is $1 \times 10^{18}$ cm$^{-3}$. The electrode layers 4 and 4' are then formed on the semiconductor layer 3 by sequentially depositing a metal hydride layer 7 made of Pd and a metal nitride layer 8 made of Ti, in this order, on the semiconductor layer 3 inside a vacuum deposition apparatus by an electron beam method. The thicknesses of the metal hydride layer 7 and the metal nitride layer 8 are set to be 20 nm and 50 nm, respectively. In forming the metal hydride layer 7 and the metal nitride layer 8, the ultimate vacuum degree is $1 \times 10^{-7}$ Torr, and the vacuum degree at the deposition is $5 \times 10^{-7}$ Torr. The electrode layers 4 and 4' thus formed have a circular cross section having a diameter of 500 μm. The distance between the centers of these two circular electrodes is 1 mm.

Figure 4:
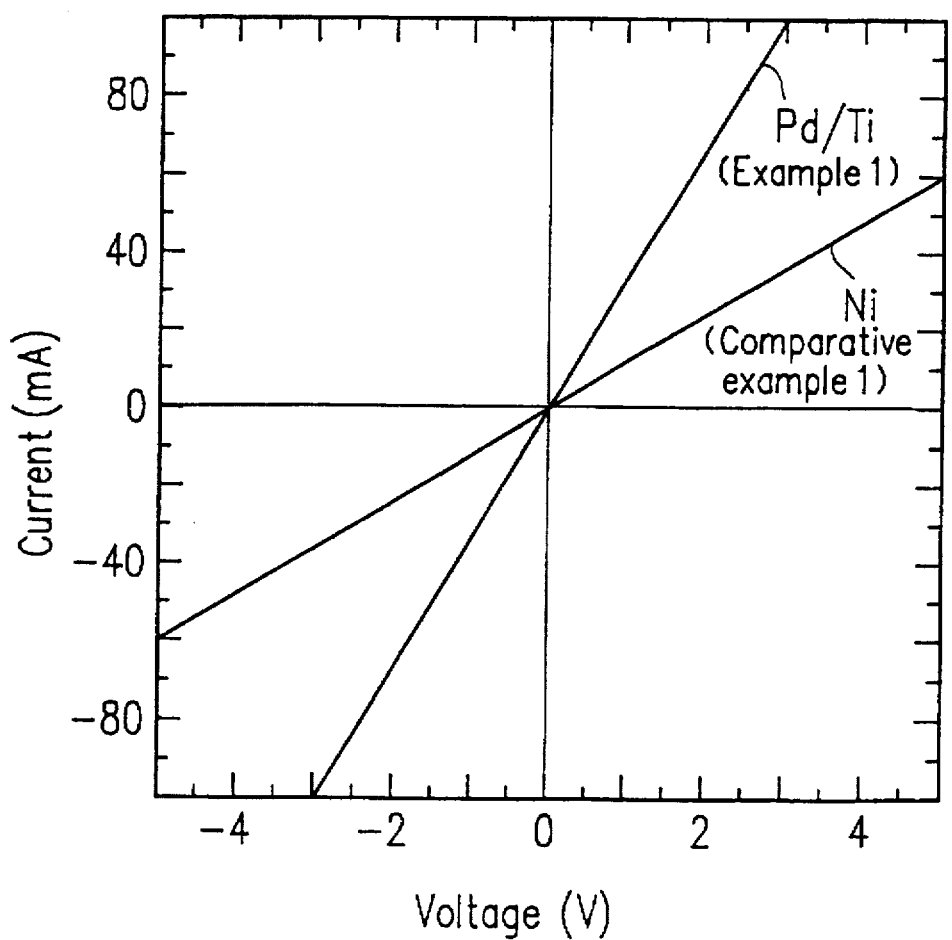
FIG. 4 is a graph showing current-voltage characteristics of the respective electrode structures of Example 1 and Comparative Example 1.

FIG. 4 shows the resulting current-voltage characteristics between the electrode layers 4 and 4' of this electrode structure.

Comparative Example 1

In this comparative example, an electrode structure as shown in FIG. 1 is fabricated in the same way as in the first example, except that Ni is used instead of Pd and Ti as the electrode layers 4 and 4'. This electrode structure corresponds to one of the electrode structures exhibiting excellent ohmic characteristics disclosed in Japanese Laid-Open Patent Publication No. 5-291621. FIG. 4 also shows the resulting current-voltage characteristics between the electrode layers 4 and 4' of the electrode structure of this comparative example, along with the results of the above-described Example 1.

As is apparent from FIG. 4, the electrode structure of Example 1 exhibits much more ideal ohmic characteristics as compared with those of the electrode structure of Comparative Example 1.

Example 2

Figure 5:
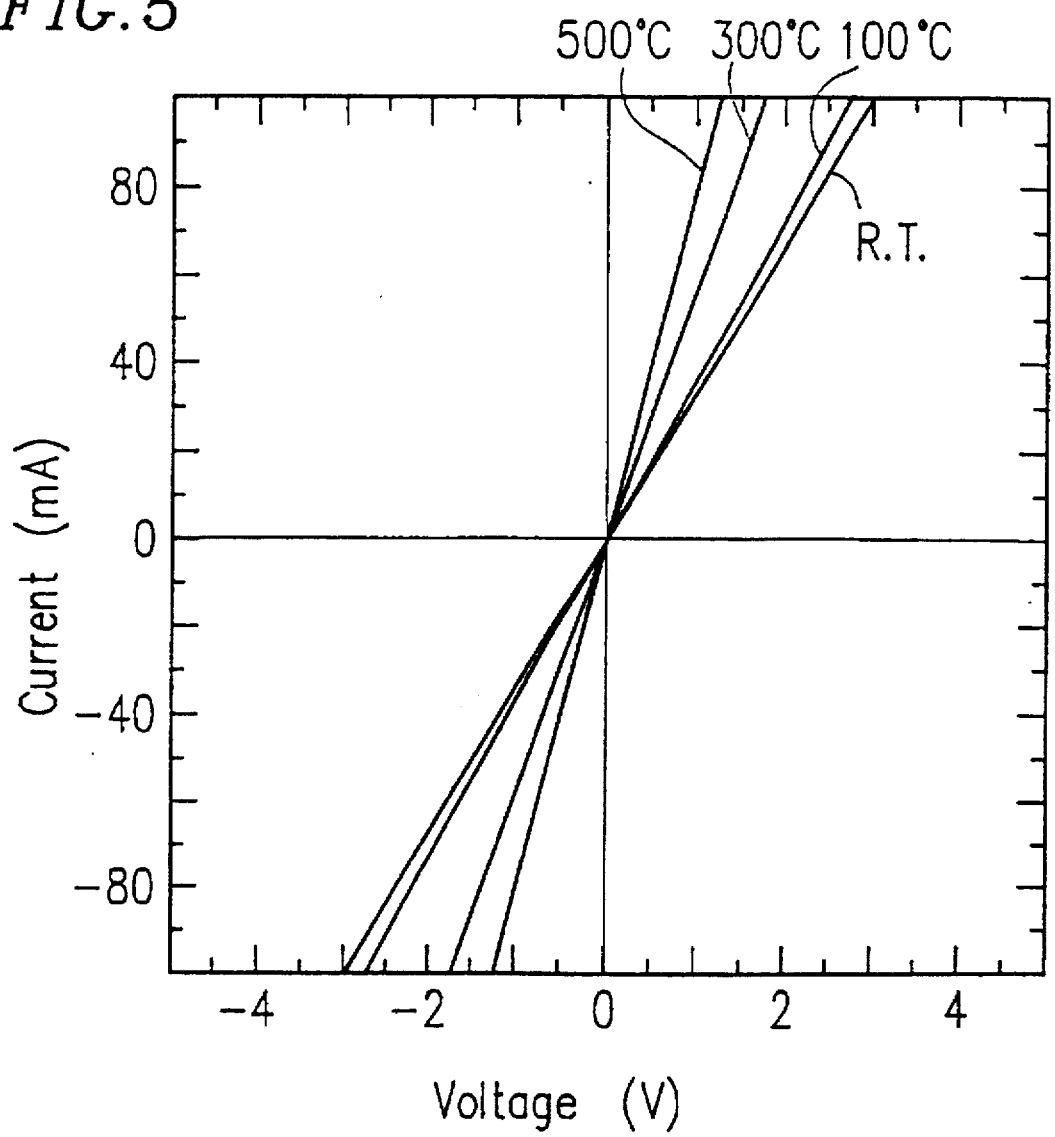
FIG. 5 is a graph showing the dependence of the current-voltage characteristics of the electrode structure of Example 1 upon the annealing temperature.

The effect of the annealing process on the electrode structure is inspected in the following manner. The electrode structure obtained in Example 1 is annealed in an electric furnace. The annealing process is performed three times at temperatures of 100° C., 300° C. and 500° C., respectively. The annealing time is set to be 10 minutes in any of these annealing processes. FIG. 5 shows the respective current-voltage characteristics of the electrode structure annealed at the three temperatures and those of the electrode structure of Example 1 which is not annealed.

As is apparent from FIG. 5, the annealing process improves the ohmic characteristics. The result shown in FIG. 5 also indicates that the higher the annealing temperature is, the more ideal the ohmic characteristics becomes, and that the ohmic characteristics are remarkably improved by performing the annealing process at 300° C. or higher. The results shown in FIG. 5 also indicate that the electrode structure of the invention has excellent physical and chemical properties. More specifically, the crystal structure in the vicinity of the interfaces between the semiconductor layer 3 and the electrode layers 4 and 4' in this electrode structure can be annealed at 500° C.

Example 3

Figure 6:
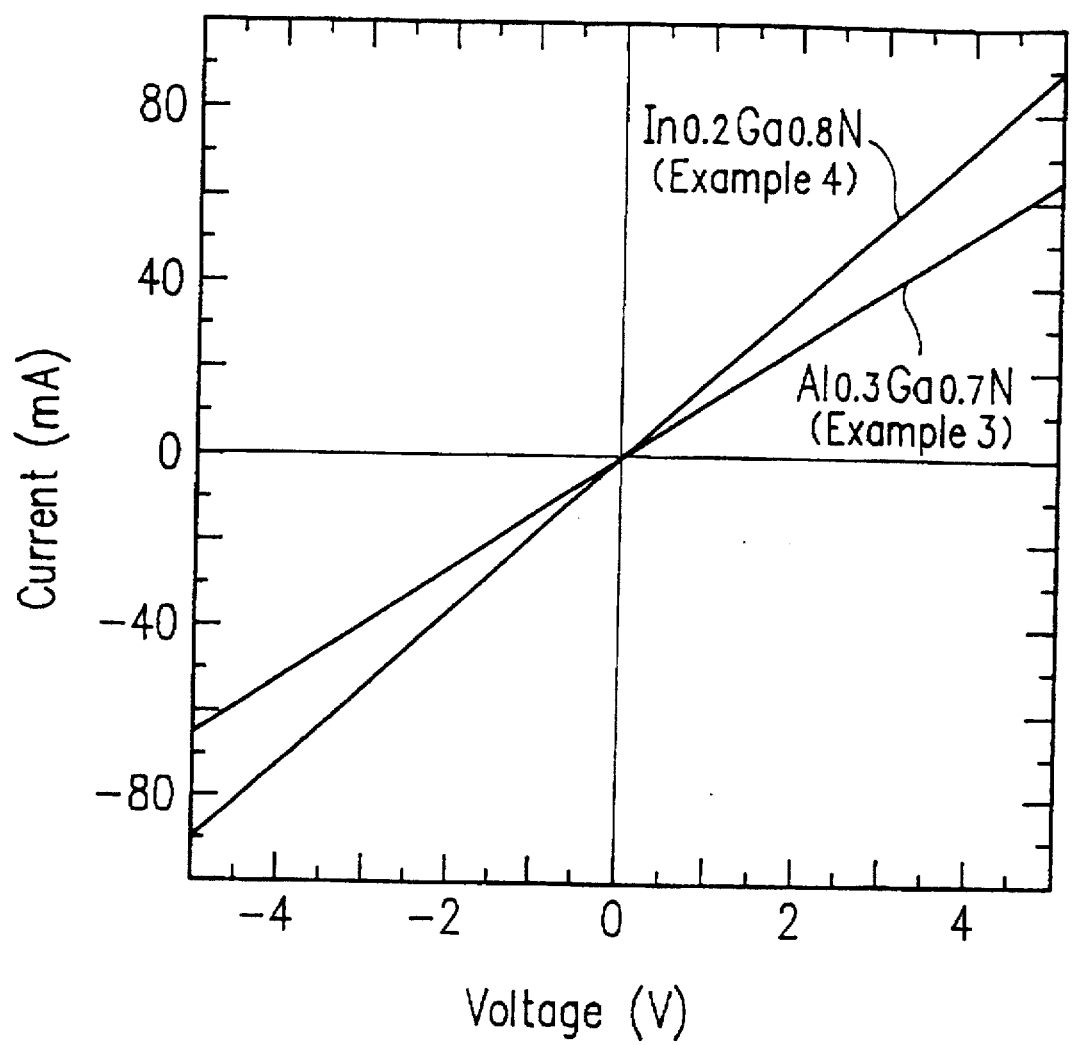
FIG. 6 is a graph showing current-voltage characteristics of the electrode structures of Examples 3 and 4.

In the third example, an electrode structure as shown in FIG. 1 is fabricated in the same way as in the first example, except that $Al_{0.3}Ga_{0.7}N$ having a carrier density of $5 \times 10^{17}$ cm$^{-3}$ is used instead of GaN as the semiconductor layer 3, and that an intermetallic compound containing Hf and Nb is used instead of Pd and Ti as the electrode layers 4 and 4'. Accordingly, the electrode layers 4 and 4' of this electrode structure includes a metal hydride layer made of $HfH_2$ and a metal nitride layer made of NbN. FIG. 6 shows the resulting current-voltage characteristics between the electrode layers 4 and 4' of the electrode structure of this example.

Example 4

In the fourth example, an electrode structure as shown in FIG. 1 is fabricated in the same way as in the third example, except that $In_{0.2}Ga_{0.8}N$ having a carrier density of $5 \times 10^{17}$ cm$^{-3}$ is used instead of $Al_{0.3}Ga_{0.7}N$ as the semiconductor layer 3. FIG. 6 also shows the resulting current-voltage characteristics between the electrode layers 4 and 4' of the electrode structure of this example, along with the results of Example 3.

As is apparent from FIG. 6, both the electrode structures obtained in Examples 3 and 4 exhibit ideal ohmic characteristics. In particular, the electrode structure obtained in Example 4 exhibits excellent ohmic characteristics.

Example 5

In the fifth example, an electrode structure as shown in FIG. 1 is fabricated in the same way as in the first example, except that various combinations of the nitride forming metals and the hydrogen absorbing metals shown in the following Table 1 are used as the electrode layers 4 and 4'. The resulting electrode structure is then annealed at 500° C. for ten minutes. The current-voltage characteristics between the electrode layers 4 and 4' of the resulting electrode structure are inspected so as to obtain the resistance values shown in Table 1.

TABLE 1

| | A | | | | | | | |
|---|---|---|---|---|---|---|---|---|
| B | Sc (−61) | Ti (−74) | V (−35) | Cr (−24) | Zr (−87) | Nb (−51) | La (−65) | Ta (−54) |
| Y | 29.3 | 20.2 | 62.5 | 70.8 | 15.8 | 40.5 | 28.7 | 36.7 |
| Pd | 15.0 | 13.9 | 35.6 | 50.3 | 10.0 | 17.2 | 14.5 | 16.3 |

TABLE 1-continued

| | A | | | | | | | |
|---|---|---|---|---|---|---|---|---|
| B | Sc (−61) | Ti (−74) | V (−35) | Cr (−24) | Zr (−87) | Nb (−51) | La (−65) | Ta (−54) |
| Ce | 29.7 | 28.1 | 74.0 | 98.7 | 20.3 | 34.0 | 30.8 | 35.2 |
| Pr | 43.8 | 35.6 | 55.3 | 60.2 | 30.5 | 38.3 | 44.3 | 37.2 |
| Nd | 49.7 | 38.6 | 60.3 | 70.6 | 31.8 | 40.7 | 48.3 | 39.3 |
| Sm | 15.1 | 14.2 | 36.0 | 48.3 | 11.0 | 18.3 | 15.9 | 17.2 |
| Eu | 22.6 | 21.3 | 65.3 | 72.7 | 20.7 | 35.3 | 30.5 | 35.2 |
| Gd | 20.4 | 15.8 | 58.7 | 60.3 | 15.6 | 30.3 | 24.6 | 25.2 |
| Tb | 13.7 | 14.0 | 38.3 | 48.1 | 11.3 | 18.1 | 15.7 | 17.3 |
| Dy | 47.2 | 45.3 | 87.1 | 87.3 | 24.3 | 48.3 | 47.1 | 49.2 |
| Ho | 37.6 | 18.8 | 52.7 | 55.3 | 17.6 | 41.7 | 40.3 | 42.6 |
| Er | 35.1 | 18.7 | 53.5 | 56.2 | 18.6 | 36.8 | 32.3 | 34.4 |
| Tm | 27.6 | 20.3 | 66.3 | 65.3 | 21.7 | 30.7 | 24.3 | 30.4 |
| Yb | 29.9 | 27.8 | 39.3 | 40.8 | 25.6 | 34.6 | 29.3 | 31.6 |
| Hf | 50.2 | 44.3 | 72.9 | 80.3 | 39.3 | 53.7 | 48.7 | 50.7 |

(unit: Ω)
A: Nitride forming metal
B: Hydrogen absorbing metal
Note: The numerals in the parentheses shown under the respective nitride forming metals denote the variation amount (kcal/mol) of the free energy when the metals are nitrified.

As is apparent from Table 1, the electrode structure using the nitride forming metal and the hydrogen absorbing metal shows low resistance values, i.e., excellent ohmic characteristics.

As described above, according to the present invention, it is possible to obtain an electrode structure having an ideal ohmic contact showing an extremely small contact resistance between the semiconductor layer and the electrode layer. In addition, crystals having an appropriate stoichiometric ratio are formed in the interface between the semiconductor layer and the electrode layer, so that an electrode structure having excellent physical and chemical properties can be obtained.

By using such an electrode structure, a semiconductor device operating at a lower operational voltage and exhibiting more ideal resistivity, e.g., a blue-light-emitting diode, can be obtained as compared with the case of using a conventional electrode structure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electrode structure comprising a p-type $Al_xGa_yIn_{1-x-y}N$ ($0 \leq x \leq 1$, $0 \leq y \leq 1$, $x+y \leq 1$) semiconductor layer and an electrode layer formed on the semiconductor layer, wherein the electrode layer contains a mixture of a metal nitride containing a first metal and a metal hydride containing a second metal, wherein the first metal and the second metal are different.

2. An electrode structure according to claim 1, wherein the metal nitride containing the first metal is selected from a group consisting of ScN, TiN, VN, CrN, ZrN, NbN, LaN and TaN.

3. An electrode structure according to claim 1, wherein the metal hydride containing the second metal is selected form a group consisting of $YH_2$, $CeH_2$, $PrH_2$, $NDH_2$, $SmH_2$, $EuH_2$, $YbH_2$, $HfH_2$, PdH, TmH, ErH, HoH, DyH, TbH and GdH.

* * * * *